Figure 1:
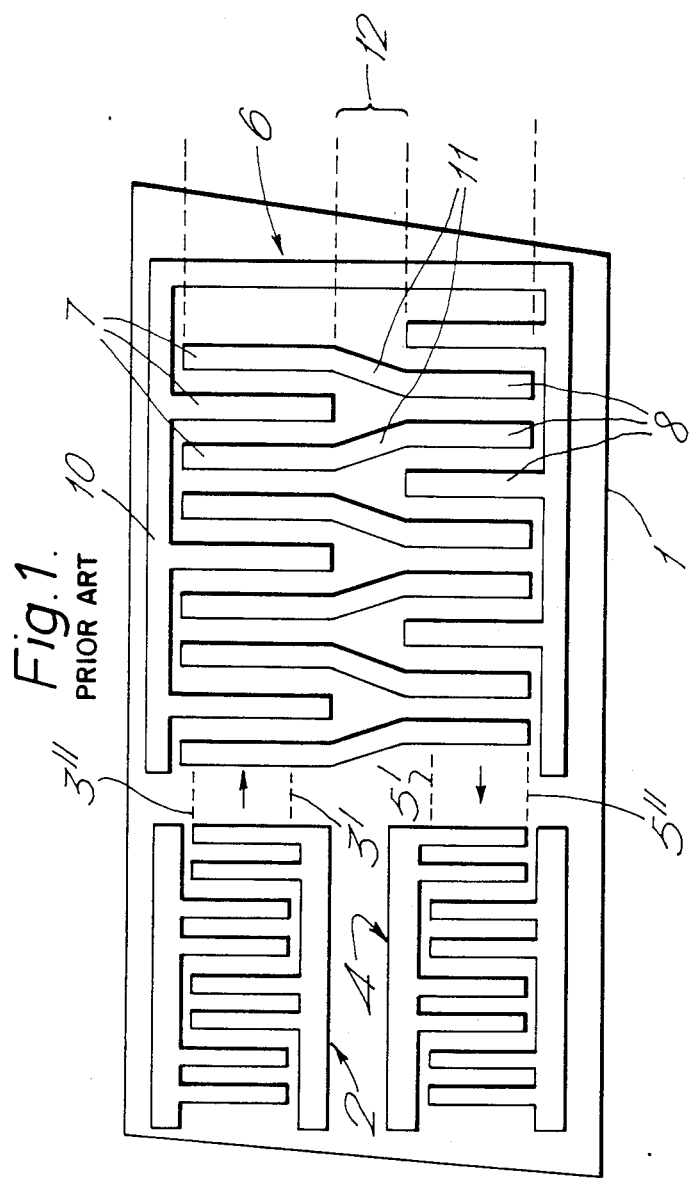

United States Patent [19]

Schofield

[11] Patent Number: 4,575,698

[45] Date of Patent: Mar. 11, 1986

[54] SURFACE ACOUSTIC WAVE DEVICE

[75] Inventor: John Schofield, Coulsdon, England

[73] Assignee: U.S. Philips Corporation, New York, N.Y.

[21] Appl. No.: 665,837

[22] Filed: Oct. 29, 1984

[30] Foreign Application Priority Data

Oct. 31, 1983 [GB] United Kingdom ............... 8328965

[51] Int. Cl.$^4$ ...................... H03H 9/145; H03H 9/64
[52] U.S. Cl. .................................. 333/195; 333/153;
333/154; 310/313 D
[58] Field of Search .............................. 333/193–196,
333/150–155; 310/313 R, 313 A, 313 B, 313 C,
313 D; 331/107 A

[56] References Cited

U.S. PATENT DOCUMENTS 3,946,342 3/1976 Hartmann ........................ 333/196
4,237,433 12/1980 Tanski ............................. 333/195
4,331,943 5/1982 Cross et al. ..................... 333/195 X
4,510,471 4/1985 Flinn et al. ...................... 333/195

Primary Examiner—Marvin L. Nussbaum
Attorney, Agent, or Firm—Robert T. Mayer; Bernard Franzblau

[57] ABSTRACT

A low insertion loss surface acoustic wave filter in which withdrawal weighted launching and output transducers 20, 40 are acoustically coupled by two high efficiency reflective multistrip couplers 6, 6'. To reduce the insertion loss, the inner bus bars 21, 41 are reduced in width so as to reduce the dead space 12 in the coupler. This makes it impossible to form a reliable wire bond connection to the inner bus bars which are therefore connected via a conducting path across the propagation path at the ends of the transducers. Further reduction in the widths of the inner bus bars and consequent increase in resistive losses are offset by several connections to a further bus 23, 43 via groups 25 of dummy electrodes arranged at null points in the weighting pattern.

14 Claims, 8 Drawing Figures

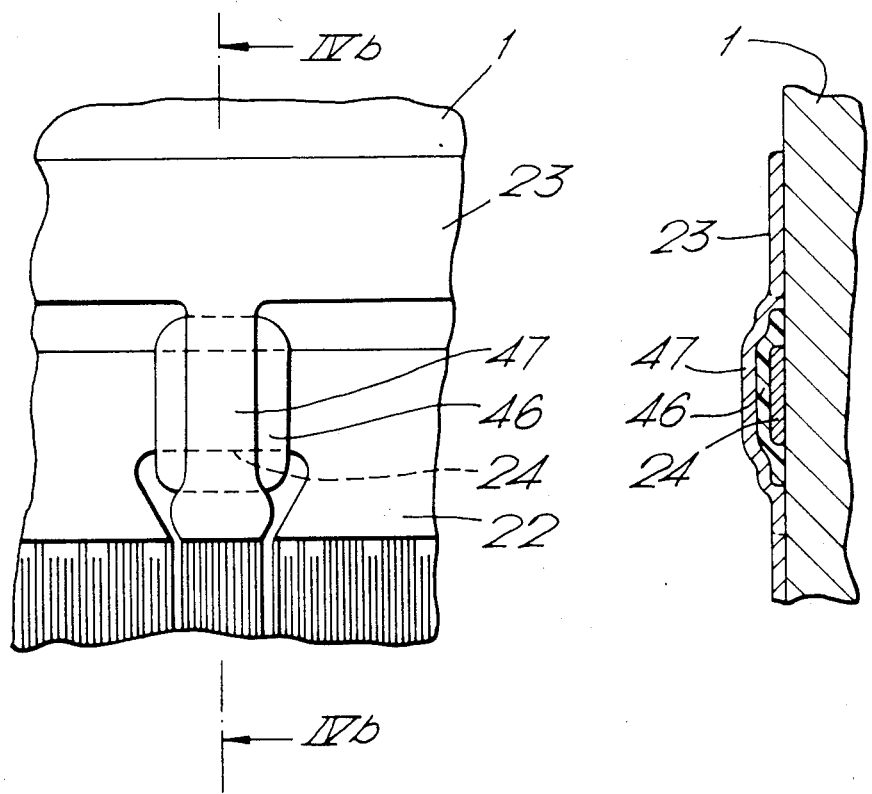

SURFACE ACOUSTIC WAVE DEVICE

The invention relates to a surface acoustic wave device comprising a piezoelectric substrate for propagating a surface acoustic wave at a surface thereof, transducer means applied to said surface for launching surface acoustic wave energy along a first track and for converting surface acoustic wave energy propagating along a further non-overlapping track substantially parallel to said first track into an electrical signal, and multistrip reflective coupler means arranged to receive surface acoustic wave energy launched by said transducer means along said first track and to relaunch at least some of the received surface acoustic wave energy along said further track towards said transducer means, in which said transducer means comprises respective wide-aperture launching and receiving transducers arranged adjacent one another, each transducer being formed as an interdigital electrode array comprising parallel strip electrodes which are respectively connected to a corresponding one or other of a pair of conductive strips which respectively form an inner and an outer bus bar extending along the corresponding adjacent (inner) and opposite (outer) sides of the interdigital electrode array.

A general form of such a surface acoustic wave device has been described, for example, in EP-A- 0 098 661 and can be used as a band-pass filter, for example in an amplifier or a receiver. The process of track-changing is commonly employed in surface acoustic wave filters in order to reduce the transfer of energy from the launching to the receiving transducer by means of the various bulk acoustic wave modes which are themselves also launched and received by the type of interdigital transducer normally employed, and which have propagation velocities which differ, in some cases only slightly, from the propagation velocity of the desired surface acoustic waves. Hitherto such a device has commonly employed the form of forward transfer multistrip coupler disclosed for example in British Patent Specification G.B. 1,372,235. This form of coupler, when suitably proportioned and arranged, can transfer surface acoustic wave energy relatively efficiently to another track in the same direction as that of the incident wave launched along the first track, i.e. with a desirably low transfer loss. However, a conventional interdigital transducer will launch surface propagating acoustic wave energy equally in respective opposite directions from the two ends, but a forward multistrip coupler can only conveniently couple one end of the launching (input) transducer to one end of the receiving (output) transducer. As a result, acoustic energy launched from the other end of the launching transducer has to be absorbed or scattered and is lost, and this sets a lower limit to the insertion loss of such a device. Such losses can sometimes be tolerated provided that the signal levels at which the device is to operate are high compared with circuit noise, as in the case of high level amplifiers. When, however, the device is to be employed, for example, in the early stages of a broadcast receiver, it is important to reduce the insertion loss as far as possible in order to provide a satisfactory signal-to-noise ratio. It can also be important to reduce losses in a duplexer filter for a transportable transceiver, for example for use in cellular radio system, in order to reduce the size and consumption of the transmitter for a given effective radiated power.

The compact and potentially efficient form of reflective multistrip coupler described in the above mentioned EP-A- 0 098 661 can provide a convenient means for coupling each end of a launching transducer to a corresponding end of an associated receiving transducer to form an arrangement which enables surface acoustic wave energy launched from both ends of a launching transducer to be transferred in cooperating transductive relationship to a receiving transducer, greatly reducing the overall insertion loss of the resultant device. However, because the launching and receiving transducers must in this case be mounted side by side, the insertion loss via each coupler has been found to be greater than the values that can be achieved by the forward coupling arrangement for the following reason.

Referring to FIG. 1 which shows a device employing a reflective multistrip coupler of the kind described in said European Patent application, it will be seen that, even when a uniform, wide-aperture, launching transducer 2 is employed, the surface acoustic wave energy launched thereby will be confined laterally to the acoustic aperture of the transducer which is defined by the maximum overlap of two adjacent interdigital electrodes of opposite signal polarity, i.e. between the dashed lines 3', 3''. Similarly in the case of the uniform, wide-aperture, receiving transducer 4, only surface acoustic wave energy which is incident within the acoustic aperture of the transducer, i.e. between the lines 5' and 5'', will be converted into electrical signal energy thereby. However, the effective input and output acoustic apertures of the receiving and relaunching arrays 7, 8, of the reflective multistrip coupler 6 are difficult to match to the transducer apertures. If the aperture of the receiving array 7 is too small, input energy will be lost past the side of the array, and if the aperture is too wide the potentials induced in the coupler will be less than optimal and some energy will tend to be relaunched by parts of the array 7 which do not overlap the input track 3', 3''. Similarly if the effective acoustic aperture of the output array 8 of the coupler does not coincide with the acoustic aperture of the receiving array 4, loss of surface acoustic wave energy will again occur. Energy can and in general will also be lost by the interconnecting conductor portions 11 at the centre of the reflective multistrip coupling partly because the effective apertures of the arrays 7 and 8 tend to extend into the interconnecting region and partly because the interconnecting conductors themselves tend to cause loss both resistively and by launching surface and bulk waves within the central region 12. This latter form of loss can be reduced by reducing the distance between the acoustic apertures of the launching and receiving transducers 2 and 4, but this will eventually entail reducing the width of the adjacent bus bars of the launching and receiving transducers 2, 4, and below a certain width this will increase signal current losses along these interdigital arrays. However, even before the longitudinal resistive losses in the inner bus bars start to become significant, the width of each inner bus bar will already have been reduced to the point where it would be difficult if not impossible during manufacture to make a reliable wire bond connection thereto in the case of a so called low-loss surface acoustic wave device in which a reflective coupler is situated at each end of the transducer, since the difficulty will then arise that there would be no non-communicating end to either transducer beyond which an enlarged connection region could be formed in either of the inner bus bars without encroaching on the desired surface acoustic wave propagation path through the device and hence undesirably affecting the signal transfer characteristics of the device.

It is an object of the invention to reduce some or all of these difficulties.

According to the invention there is provided a surface acoustic wave device comprising a piezoelectric substrate for propagating a surface acoustic wave at a surface thereof, transducer means applied to said surface for launching surface acoustic wave energy along a first track and for converting surface acoustice wave energy propagating along a further non-overlapping track substantially parallel to said first track into an electrical signal, and multistrip reflective coupler means arranged to receive surface acoustic wave energy launched by said transducer means along said first track and to relaunch at least some of the received surface acoustic wave energy along said further track towards said transducer means. The transducer means comprises respective wide-aperture launching and receiving transducers arranged adjacent one another, each transducer being formed as a withdrawal weighted interdigital electrode array comprising strip electrodes extending across the full width of the acoustic aperture of the transducer, which are respectively connected to a corresponding one the other of a pair of conductive strips which respectively form an inner and an outer bus bar extending along the corresponding adjacent (inner) and opposite (outer) sides of the interdigital electrode array. The invention is characterised in that in order to reduce the spacing between the corresponding acoustic apertures of the transducers, the adjacent inner bus bars of the respective launching and receiving transducers are each reduced in width to the extent that resistive losses for a signal current flowing along the bus bar become significantly greater than for a corresponding current flowing along the outer bus bar, and there are provided at intervals along the outer edge of the corresponding transducer electrode array, a plurality of conductive connection regions each electrically connected to a group of strip electrodes in the array which are also electrically connected to the inner bus bar. The conductive connection regions relating to a given transducer are all electrically connected together and to a terminal connection for said inner bus bar. A further bus bar can be provided, in accordance with a feature of the invention, to the outer side of each outer bus bar which latter would normally be at an associated signal potential, and the conductive connection regions can each be connected to the further bus bar either by wire bond connections or via an associated conducting layer applied to the surface of an insulating layer which has been formed so as to cross the aforementioned outer bus bar. Normally the further bus bar, and therefore the inner bus bar connected thereto, would be connected to ground potential with respect to signal frequencies.

In further accordance with the invention there is provided a low-loss surface acoustic wave bandpass electrical filter including a piezoelectric substrate able to propagate acoustic waves at a surface thereof, input transducing means arranged to launch acoustic wave energy along a propagation track at said surface, output transducing means arranged to receive acoustic wave energy from a further propagation track at said surface which is substantially parallel to but does not overlap said first track, and electrical reflective multistrip coupling means arranged to receive acoustic wave energy from each end of the input transducing means and to relaunch at least part of that energy as acoustic wave energy back towards a corresponding end of the output transducing means in a co-operating transductive relationship. The said input and output transducing means respectively comprise corresponding wide aperture transducers located adjacent one another and each transducer is formed as an interdigital electrode array comprising parallel strip electrodes which are respectively connected to a corresponding one or the other of a pair of conductive strips which respectively form an inner and an outer bus bar extending along the corresponding adjacent (inner) and opposite (outer) sides of the interdigital electrode array. The reflective coupling means are formed by respective reflective multistrip couplers each comprising a first and a second array of mutually parallel conducting strips arranged respectively across an input and an output propagation track, each array consisting of a first set of mutually insulated alternately widely and closely spaced strips, and a second set of electrically interconnected strips arranged so that at least one strip from the second set is situated between substantially every widely spaced pair of strips forming the first set, each strip forming a widely spaced pair in the first set of one array being respectively connected to a corresponding strip forming a closely spaced pair in the first set of the other array and the second set of strips in both arrays being connected together. The invention is characterized in that for each respective said transducer there is provided a respective electrically conductive strip-like surface layer extending across the full width of the acoustic aperture of the transducer at at least one end thereof, said strip-like layer being electrically continuous at the inner end with said inner bus bar and at the outer end with an associated conductive connection region located outside the outer boundary of the strip-electrode array of the transducer, said associated conductive connection region being electrically connected to a terminal connection for said inner bus bar. Each of the electrically conductive strip-like surface layers extending across the full width of the associated acoustic aperture can, in accordance with further features of the invention, be formed of a plurality of parallel electrically conductive strips having the same mark-to-space ratio as the electrodes of the adjacent transducer, and each strip can have the same width as that of the strip electrodes forming the adjacent transducer array.

The invention is based on the realisation that when, in an acoustic wave device of the kind specified, the adjacent bus bars of the launching and receiving transducers are reduced in width so that the acoustic apertures of the respective transducers can be brought closer together to reduce or minimise losses in the reflective multistrip coupler, the metallisation pattern of the inner bus bar first becomes too narrow for an external wire bond connection to be made reliably thereto during the manufacture of the device and that this can be overcome by making an electrical connection across the surface acoustic wave propagation path by means of an electrically conducting surface layer or of a group of strip electrodes to a larger conductive area lying beyond the outer edge of the propagation path, and that in the case of a withdrawal weighted interdigital transducer, if the width of each inner bus bar is reduced still further until the resistance of the bus bar to signal currents flowing therealong becomes significant, the resultant resistive loss can be usefully reduced by using groups of dummy electrodes situated at the null points of the weighting pattern to connect the narrow bus bar at a plurality of points therealong to one or more conductive connection regions situated in the vicinity of the outer edge of the transducer which can be readily electrically interconnected by suitable conductors of low resistance.

Figure 2:
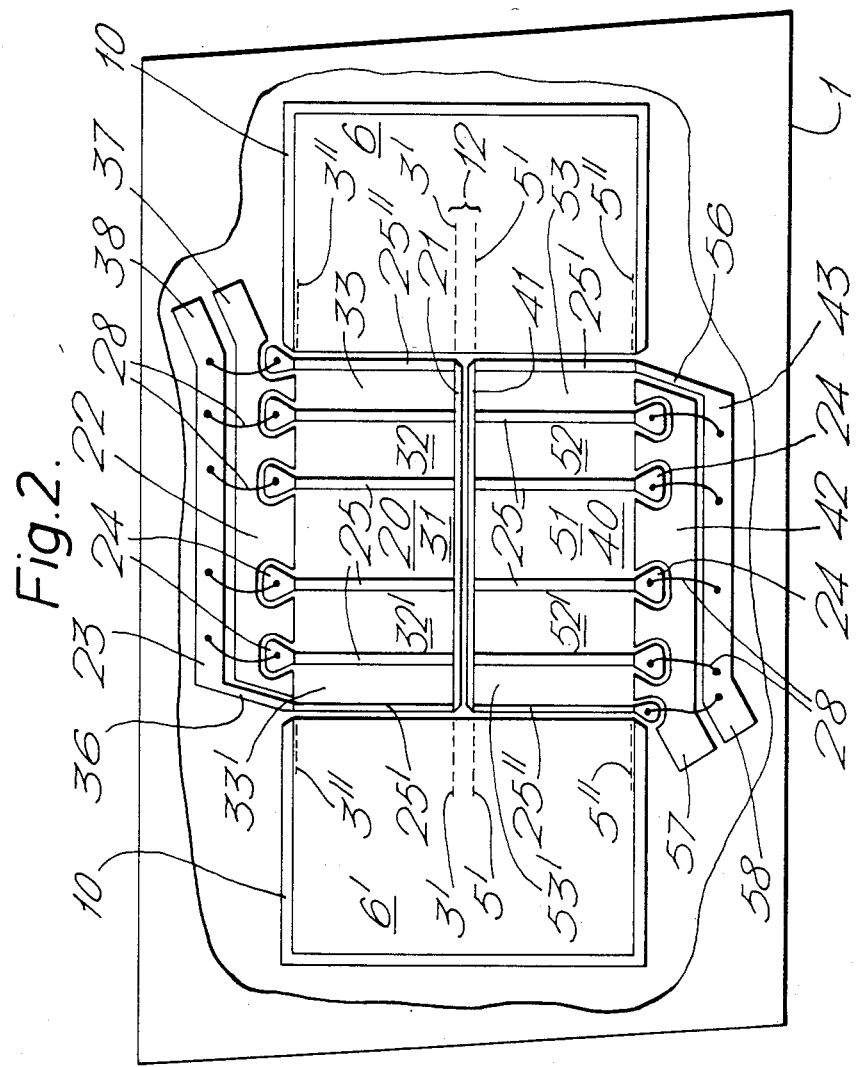
Figure 3A:
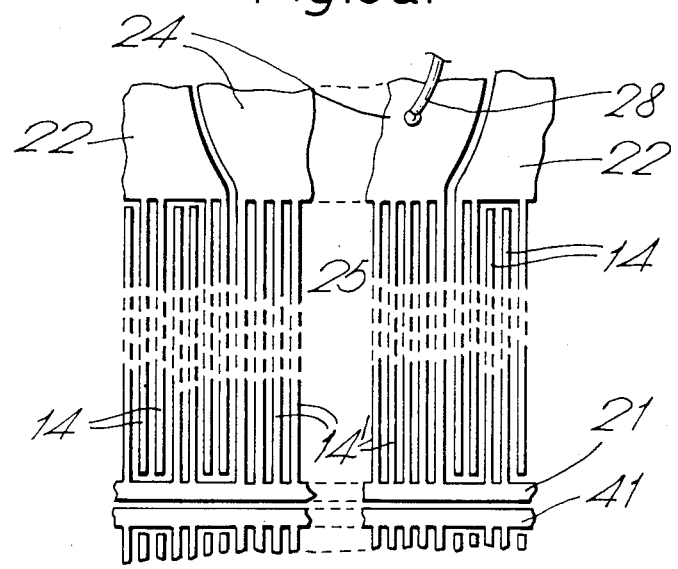
Figure 3B:
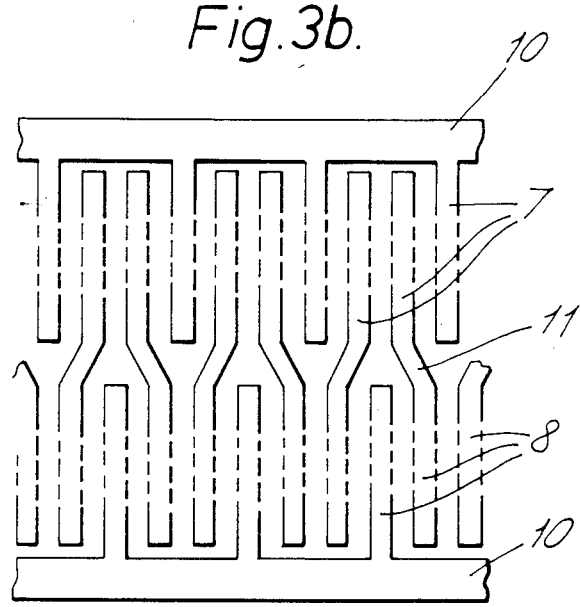
Figure 5:
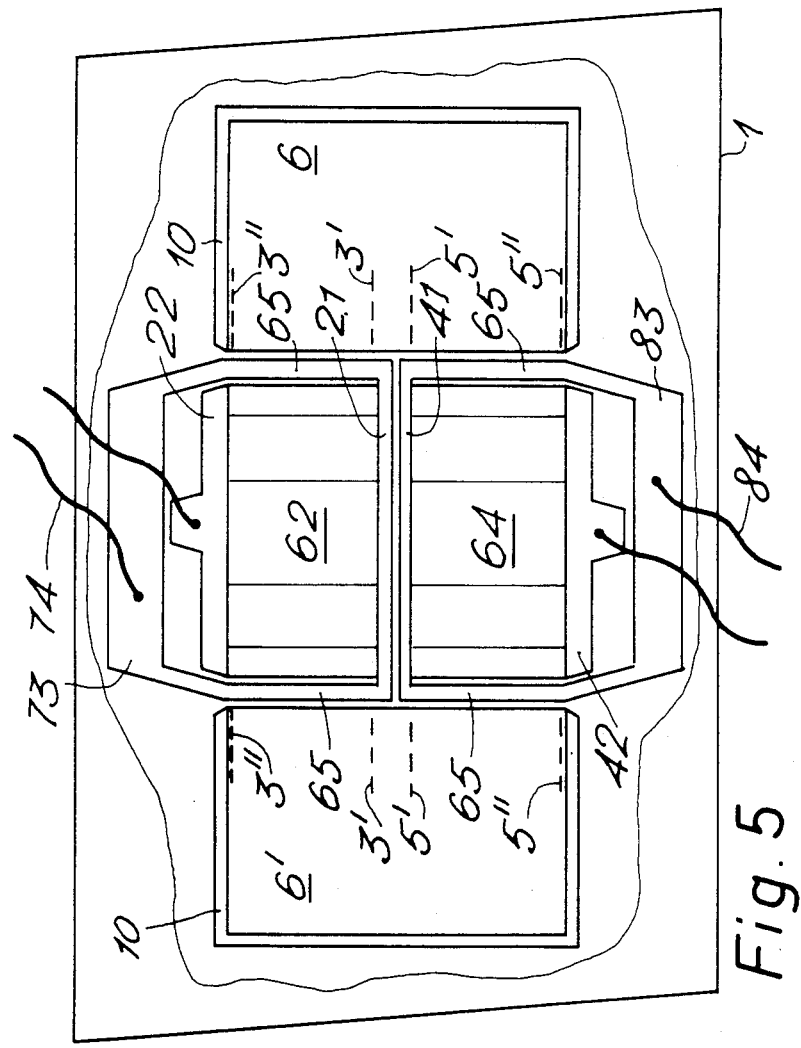
Figure 6:
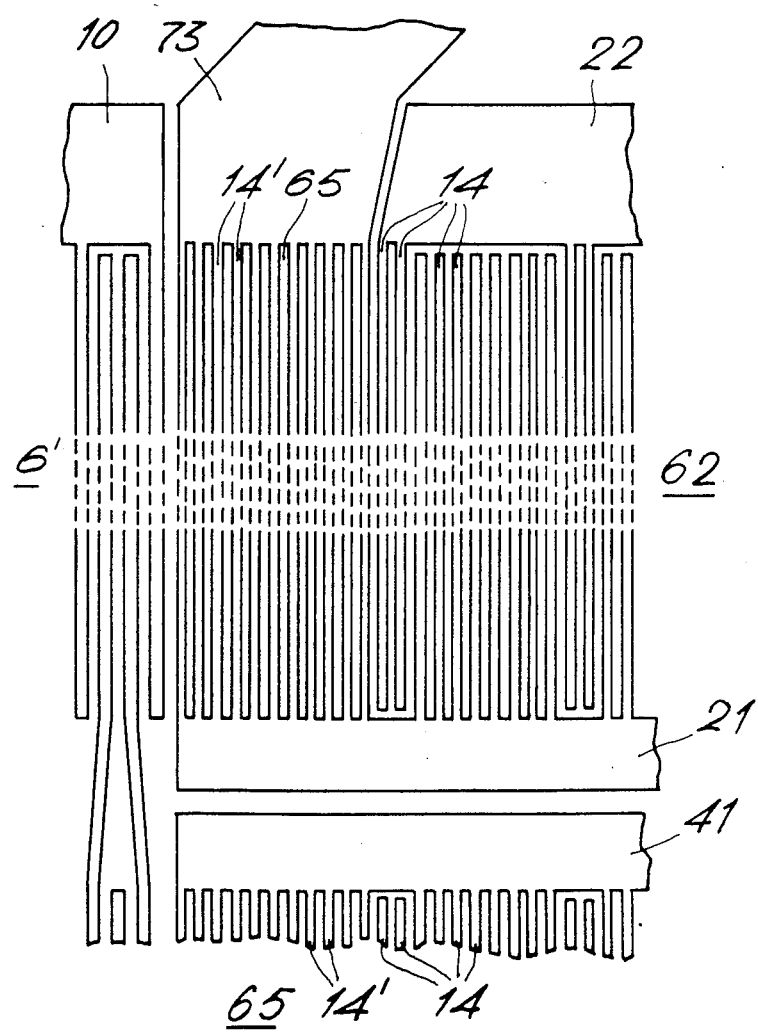

Embodiments of the invention will now be decribed by way of example, with reference to the remaining figures of the accompanying drawings, in which:

FIG. 1 illustrates a prior art surface acoustic wave device,

FIG. 2 is a diagrammatic illustration of a surface acoustic wave device in accordance with the invention, FIGS. 3a and 3b are details illustrating part of the structure of one of the transducers and of a reflective multistrip coupler employed in the device shown in FIG. 2, FIGS. 4a and 4b are details of a transducer forming part of an alternative form of a device in accordance with the invention, FIG. 5 is a diagrammatic illustration of a further surface acoustic wave device in accordance with the invention, and FIG. 6 is a detail illustrating part of the device shown in FIG. 5.

FIG. 2 illustrates diagrammatically a surface acoustic wave filter device in accordance with the invention, comprising a piezoelectric substrate 1 having on the surface thereof a withdrawal weighted interdigital launching transducer 20, a similar receiving transducer 40, and two reflective multistrip couplers 6 and 6' of the kind described in EP-A- 0 098 661. The transducers 20 and 40 are wide aperture transducers meaning that the width of each array is greater than about 6λ, and in the present embodiments can be from about 30λ to 100λ or more. Since the strip electrodes making up the interdigital array are, conventionally, double electrodes λ/8 wide spaced λ/8 apart, it would be impracticable to depict the individual electrodes in FIG. 2, and different parts of the arrays are therefore indicated by generalised regions in the drawing.

The device of FIG. 2 is intended to form a filter having as low an insertion loss as possible within the desired pass band. For this reason, a reflective multistrip coupler 6, 6', is situated at each end of the transducers so that full use can be made of the bidirectional properties of the interdigital transducers 20, 40. The reflective multistrip couplers are preferably each formed with an electrode spacing of λ/3 since this has been found experimentally to provide a satisfactory low loss, suppression of the third harmonic, and a good pass band characteristic. The transducers 20, 40 have interdigital electrodes of uniform length and are withdrawal weighted to provide the necessary design flexibility required to provide the desired frequency response characteristic without the additional loss that could have occurred if apodisation had been employed for response tailoring.

The interdigital arrays 20, 40 each comprise a parallel arrangement of double electrodes connected alternately to one or the other of two signal bus bars 21 and 22, or 41 and 42 respectively in order to form a launching or receiving element. Where a maximum transducing effect is required, for example in a central region 31, 51, of the respective array and commonly called the main lobe, successive double electrodes will be connected to a bus-bar of opposite polarity, at least in the centre of the region. Where a smaller transducing effect is required, adjacent pairs of oppositely connected double electrodes are spaced from one another, preferably by dummy (double) electrodes, namely electrodes connected to the same bus bar, so that the propagation velocity along the array is maintained uniform. This thinning out of active pairs of electrodes can be employed at either end of the main lobe 31, 51, and to a varying degree throughout the first and second minor lobes 32, 32' and 52, 52', and 33, 33' and 53, 53', respectively of the two transducers. In general the first minor lobes 32, 32' and 52, 52' will have an opposite transducing polarity from that of the main lobe 31, 51 and of the second minor lobes 33, 33' and 53, 53'. The various lobes will be separated by regions having no transducing effect, commonly called null regions or nulls.

In order to reduce losses due to the width of the dead centre space 12 of the reflective multistrip couplers 6, 6' and hence to reduce the insertion loss of the device as far as practicable, the apertures 3' 3" and 5' 5" of the launching and receiving transducers 20, 40 are brought close together, in accordance with the invention, by reducing the width of each of the inner bus bars 21 and 41 of the respective transducers 20 and 40 to a dimension such that resistive losses for a signal current flowing along the bus bar 21 or 41 become significantly greater than for a corresponding current flowing along the corresponding outer bus bars 22, 42 of conventional width. In addition there are provided at intervals along the outer edge of the corresponding transducer electrode array 20, 40, a plurality of conductive connection regions 24, each electrically connected to a group 25 of strip electrodes in said array which are also electrically connected to the corresponding inner bus bar 21, 41, and the conductive connection regions 24 relating to a given transducer 20, 40, are all electrically connected together and to a corresponding terminal connection 38, 58 for the inner bus bar 21,41.

In the device shown in FIG. 2 a further bus bar 23, 43, respectively, of conventional width is provided outside the corresponding outer bus bar 22, 42, of which the terminal connection 38, 58 forms part, and is connected by wire connections 28 to each of the conductive connection regions 24. It will be apparent that a terminal group 25' of strip electrodes connected to the inner bus bar 21, 41, can be connected by a strip of metallisation 36, 56 to the corresponding further bus bar 23, 43. Although a corresponding group 25" at the other end of the array is shown connected via a wire connection 28, this can also be connected via a strip of metallisation passing round the terminal connection 37, 57 to the other bus bar, to the further bus bar 23, 43 and corresponding terminal connection 38, 58.

FIG. 3a is a detail illustrating the disposition of the strip electrodes of the interdigital array 20 in the vicinity of an intermediate connection region. The double electrodes 14 forming the transducing regions (lobes) of the array are connected to one or the other of the bus bars 21, 22 to form oppositely connected pairs or groups of pairs with, in general, one or more dummy electrodes interspersed as required to provide withdrawal weighting. At the transducing nulls, a group 25 of dummy (double) electrodes 14' are connected to the inner bus bar 21 and are also connected to the conducting connection region 24 which is separate and electrically insulated from the outer bus bar 22. The region 24 is tack wired across to the further bus bar 23, as shown in FIG. 2.

FIG. 3b, is a detail illustrating in a similar manner the construction of the reflective multistrip coupler 6. Since this is described in the said European Patent Application, it will not be further described except to say that the receiving and relaunching strip arrays are carefully dimensioned to the apertures 3' 3" and 5' 5" of the launching and receiving transducers 20, 40, as is the width of the central connection region 12.

An alternative form of the device shown in FIGS. 2 and 3 is illustrated by a detail shown in FIGS. 4a and 4b. Thus, instead of tack wiring each connection region 24 to the further bus bar, the connection can be made by depositing an insulating layer region 46 over a part of the outer bus bar 22, and then applying a connecting bridge of metallisation so as to connect the region 24 to the further bus bar 23. This embodiment requires further steps to be added to the usual process of manufacturing the device, e.g. using photolithography, and it would be a question of relative manufacturing costs at any given time as to which method of connection were to be used.

FIG. 5 illustrates a so called low-loss device embodying the invention in which the widths of the inner bus bars 21, 41 have been reduced, in order to reduce losses due to the length of the coupling region of the reflective couplers 6, 6', to an extent such that the width is still sufficient for signal currents to flow therealong without significant resistive loss but that it is no longer possible during normal manufacture to make a wire connection to the inner bus bar in a reliable and consistent manner. In such a device a respective reflective multistrip coupler 6, 6', is arranged adjacent each end of the transducers to receive acoustic wave energy from each associated end of the input transducer 62 and to relaunch at least part of that energy as acoustic wave energy back towards a corresponding end of the output transducer 64 in a cooperating transductive relationship so that the transduced signals propagating in opposite directions combine appropriately to reinforce one another with respect to the electrical signal output of the transducer within the passband. As a consequence of the double ended configuration, there is no non-communicating end to either transducer beyond which the inner bus bar could be widened into a notional rearward projection of the surface wave propagation path.

Thus, in the device of FIG. 5, there is provided, in accordance with the invention, for each respective transducer 62, 64, at least one electrically conductive strip-like surface layer 65 extending across the full width of the acoustic aperture 3', 3", and 5', 5", of the transducer 62, 64, at at least one end thereof and, as shown in FIG. 5, preferably at each end thereof. The respective strip-like layer 65 is arranged to be electrically continuous at its inner end with the corresponding inner bus bar 21, 41, of the respective transducer 62, 64, and at its outer end with an associated conductive connection region 73, 83, located outside the outer boundary of the strip electrode array of the transducer 62, 64, i.e. outside the outer boundary 3", 5", of the acoustic aperture of the corresponding transducer. The respective conductive connection region 73, 83, is electrically connected via a corresponding wire bond connection 74, 84, to a terminal connection (not shown) for the associated inner bus bar 21, 41, and which is preferably a ground connection in order to reduce electrical breakthrough because of the close proximity of the input and output transducers 62, 64.

The strip-like conducting layer 65 on the surface acoustic wave propagation surface of the substrate 1 can be formed as a uniform layer of conducting material, but unless the surface density of that layer is reduced to about half that for the remaining conductor pattern, it will give rise to a mismatch in the acoustic impedance along the surface acoustic wave propagation path causing undesirable reflections of acoustic energy. Preferably, therefore, the strip 65 is made up of a plurality of individual parallel-connected conducting strips whose width and spacing are substantially the same as that of the electrodes in the adjacent transducer array. This is illustrated by FIG. 6 which is a detail indicating the disposition of the strip electrodes 14 at one end of the interdigital transducer array 62, together with parallel-connected conducting strips 14' making up part of the strip-like conducting surface layer 65, and it will be seen that the strips 14' are arranged to have the same width and spacing, namely $\lambda/8$, as the transducer strips 14 thus ensuring that the average surface loading along the surface acoustic wave propagation path is maintained constant and undesired reflections are thereby reduced or avoided.

As shown in FIG. 6, the lower ends of all the strips 14' are electrically continuous with the inner bus bar 21, while the upper ends are similarly continuous with the associated conductive connection region 73 which is connected to the terminal connection for signal ground via the wire bond connection 74.

The pair of transducer electrodes 14 which are situated next adjacent the grounded strips 14' are themselves connected to the bus bar 22, which is connected to the signal terminal of the transducer 62, thus forming, together with the grounded strips 14', a transducing element of the transducer, and this element must be included in and allowed for in the design of the transducing array. In the particular example depicted, the withdrawal weighted transducer 62 is arranged to have a terminal transducing element having a relatively small magnitude so that the pair of electrodes 14 are then followed, to the right in FIG. 5, by a number of pairs of electrodes 14 which are all connected to the grounded bus bar 21. If, alternatively, it were desired to provide a group of elements having a larger transducing magnitude at the end of the array, a corresponding number of electrode pairs would be connected alternately to one or the other of the bus bars 21, 22 in this region.

The width of the strip-like region 65, i.e. the assembly of strips 14', should be sufficient to avoid significant resistive losses in the path of signals passing to and from the inner bus bar 21, and, bearing in mind that the mark to space ratio of the individual strips forming the region 65 in unity in the present example, the overall width should preferably be not less than twice the width of the inner bus bar 21.

A device in accordance with the invention is of advantage as a filter for the early stages of a receiver where a minimal loss of signal energy is desirable within the pass band, and can be of particular advantage as a duplexer filter for a portable transceiver in a cellular radio system since it enables the transmitter power and hence the weight of the power supply to be minimised for a given actual radiated power from the antenna.

I claim:

1. A surface acoustic wave device comprising a piezoelectric substrate for propagating a surface acoustic wave at a surface thereof, transducer means applied to said surface for launching surface acoustic wave energy along a first track and for converting surface acoustic wave energy propagating along a further non-overlapping track substantially parallel to said first track into an electrical signal, and multistrip reflective coupler means arranged to receive surface acoustic wave energy launched by said transducer means along said first track and to relaunch at least part of the received surface acoustic wave energy along said further track towards said transducer means, in which said transducer means comprises respective wide-aperture launching and receiving transducers arranged adjacent one another, each transducer being formed as a withdrawal weighted interdigital electrode array comprising strip electrodes extending across the full width of the acoustic aperture of the transducer and respectively connected to a corresponding one or the other of a pair of conductive strips which respectively form an inner and an outer bus bar extending along the corresponding adjacent (inner) and opposite (outer) sides of the interdigital electrode array, characterised in that, in order to reduce the spacing between the corresponding acoustic apertures of the transducers, the adjacent inner bus bars of the respective launching and receiving transducers are each reduced in width to an extent such that resistive losses for a signal current flowing along the inner bus bar become significantly greater than for a corresponding current flowing along the outer bus bar, and a plurality of conductive connection regions provided at intervals along the outer edge of the corresponding transducer electrode array, said plurality of conductive connection regions each being electrically connected to a group of strip electrodes in the array which are also electrically connected to the inner bus bar, and means electrically connecting all of the conductive connection regions relating to a given transducer together and to a terminal connection for said inner bus bar.

2. A surface acoustic wave device as claimed in claim 1 including a further bus bar situated to the outer side of said outer bus bar with said conductive connection regions each connected to said further bus bar by wire bond connections.

3. A surface acoustic wave device as claimed in claim 1 including a further bus bar situated to the outer side of said outer bus bar with said conductive connection regions each connected to said further bus bar via a conducting layer applied to the surface of an insulating layer formed so as to cross said outer bus bar.

4. A surface acoustic wave device as claimed in claim 1 wherein said groups of strip electrodes are arranged at null points in the weighted electrode pattern and are electrically connected to a further bus bar situated on the outer side of said outer bus bar.

5. A low-loss surface acoustic wave device comprising: a piezoelectric substrate able to propagate acoustic waves at a surface thereof, input transducing means having two ends and arranged to launch acoustic wave energy along a propagation track at said surface, output transducing means having two ends and arranged to receive acoustic wave energy from a further propagation track at said surface which is substantially parallel to but does not overlap said first track, and electrical reflective multistrip coupling means arranged to receive acoustic wave energy from each end of the input transducing means and to relaunch at least part of that energy as acoustic wave energy back towards a corresponding end of the output transducing means in a co-operative transductive relationship, wherein said input and output transducing means respectively comprise corresponding wide aperture transducers located adjacent one another with each transducer formed as an interdigital electrode array comprising parallel strip electrodes respectively connected to a corresponding one or the other of a pair of conductive strips which respectively form an inner and an outer bus bar extending along the corresponding adjacent (inner) and opposite (outer) sides of the interdigital electrode array, the reflective coupling means being formed by respective reflective multistrip couplers each comprising a first and a second array of mutually parallel conducting strips arranged respectively across an input and an output propagation track, each array comprising a first set of mutually insulated alternately widely and closely spaced strips, and a second set of electrically interconnected strips arranged so that at least one strip from the second set is situated between substantially every widely spaced pair of strips forming the first set, each strip forming a widely spaced pair in the first set of one array being respectively connected to a corresponding strip forming a closely spaced pair in the first set of the other array and the second set of strips in both arrays being connected together, characterized in that for each respective said transducer a respective electrically conductive strip-like surface layer is provided extending across the full width of the acoustic aperture of the transducer at at least one end thereof, said strip-like layer being electrically continuous at the inner end with said inner bus bar and at the outer end with an associated conductive connection region located outside the outer boundary of the strip-electrode array of the transducer, said associated conductive connection region being electrically connected to a terminal connection for said inner bus bar.

6. A low-loss surface acoustic wave device as claimed in claim 5, wherein each said respective electrically conductive strip-like surface layer which extends across the aperture of the associated transducer comprises a plurality of parallel electrically conductive strips having the same mark to space ratio as the electrode of the adjacent transducer.

7. A low-loss surface acoustic wave device as claimed in claim 6, wherein said conductive strips are the same width as the strip electrodes of the adjacent transducer array.

8. A surface acoustic wave device as claimed in claim 5 wherein the inner bus bar is narrower than the outer bus bar and is reduced in width to a degree such as to prevent the formation of a reliable wire bond connection thereto.

9. A surface acoustic wave device as claimed in claim 5 wherein each of said transducers comprises a withdrawal weighted interdigital electrode array including a plurality of strip electrodes extending across the full width of the transducer acoustic aperture.

10. A surface acoustic wave device comprising: a piezoelectric substrate able to propagate acoustic waves at a surface thereof, a wide aperture input transducer arranged to launch surface acoustic wave energy along a propagation track at said surface, a wide aperture output transducer located adjacent the input transducer and arranged to receive acoustic wave energy from a further propagation track at said surface which is substantially parallel to but does not overlap said first track, each of said transducers having two ends and formed as an interdigital electrode array comprising parallel strip electrodes which are respectively connected to a corresponding one or the other of a pair of conductive strips which form an inner and an outer bus bar extending along the corresponding adjacent (inner) and opposite (outer) sides of the interdigital electrode array, an electrical reflective multistrip coupling means arranged to receive acoustic wave energy from each end of the input transducer and to relaunch at least part of that energy as acoustic wave energy back towards a corresponding end of the output transducer in a cooperative transductive relationship, the reflective multistrip coupling means comprising respective reflective multistrip couplers each including a first and a second array of mutually parallel conducting strips arranged respectively across an input and an output propagation track, characterized in that for each transducer a respective electrically conductive strip-like surface layer is provided extending across the full width of the acoustic aperture of the transducer at each end thereof, said strip-like layers being electrically continuous at the inner end with said inner bus bar and at the outer end with an associated conductive connection region located outside the outer boundary of the strip-electrode array of the transducer and with said associated conductive connection region electrically connected to a terminal connection for said inner bus bar.

11. A surface acoustic wave device as claimed in claim 10 wherein each said electrically conductive strip-like surface layer comprises a plurality of parallel electrically conductive strips having the same mark to space ratio as the electrodes of the adjacent transducer.

12. A surface acoustic wave device as claimed in claim 11 wherein said conductive strips are the same width as the strip electrodes of the adjacent transducer.

13. A surface acoustic wave device as claimed in claim 10 wherein the inner bus bar of each transducer is narrower than the outer bus bar thereof and the inner bus bars of the input and output transducers are parallel and closely spaced to one another.

14. A surface acoustic wave device as claimed in claim 10 wherein each said electrically conductive strip-like surface layer comprises a plurality of parallel electrically conductive strips connected to ground via a conductive connection region on the substrate located outside of the respective outer bus bar.

* * * * *